(12) United States Patent
Jin et al.

(10) Patent No.: US 11,923,453 B2
(45) Date of Patent: Mar. 5, 2024

(54) LDMOS DEVICE AND METHOD FOR PREPARING SAME

(71) Applicant: CSMC TECHNOLOGIES FAB2 CO., LTD., Wuxi (CN)

(72) Inventors: Huajun Jin, Wuxi (CN); Chunxu Li, Wuxi (CN)

(73) Assignee: CSMC TECHNOLOGIES FAB2 CO., LTD., Wuxi (CN)

( * ) Notice: Subject to any disclaimer, the term of this patent is extended or adjusted under 35 U.S.C. 154(b) by 43 days.

(21) Appl. No.: 17/631,287

(22) PCT Filed: Aug. 18, 2020

(86) PCT No.: PCT/CN2020/109711
§ 371 (c)(1),
(2) Date: Jan. 28, 2022

(87) PCT Pub. No.: WO2021/068648
PCT Pub. Date: Apr. 15, 2021

(65) Prior Publication Data
US 2022/0262948 A1 Aug. 18, 2022

(30) Foreign Application Priority Data
Oct. 8, 2019 (CN) .......................... 201910948286.9

(51) Int. Cl.
*H01L 29/78* (2006.01)
*H01L 29/06* (2006.01)
(Continued)

(52) U.S. Cl.
CPC ...... *H01L 29/7823* (2013.01); *H01L 29/0611* (2013.01); *H01L 29/401* (2013.01); *H01L 29/404* (2013.01); *H01L 29/66681* (2013.01)

(58) Field of Classification Search
CPC ............ H01L 29/7823; H01L 29/0611; H01L 29/401; H01L 29/404; H01L 29/66681;
(Continued)

(56) References Cited

U.S. PATENT DOCUMENTS

2012/0319182 A1 12/2012 Satoh et al.
2014/0120694 A1* 5/2014 Kim ...................... H01L 29/665
438/586
(Continued)

FOREIGN PATENT DOCUMENTS

CN 103035722 4/2013
CN 103762237 4/2014
(Continued)

OTHER PUBLICATIONS

CN Office Action for corresponding CN Application No. 201910948225.2, 8 pages.
(Continued)

*Primary Examiner* — Shahed Ahmed
(74) *Attorney, Agent, or Firm* — Dority & Manning, PA

(57) ABSTRACT

The present invention relates to an LDMOS device and a method for preparing same. When a field plate hole is formed by etching an interlayer dielectric layer, the etching of the field plate hole is stopped on a blocking layer by means of providing the blocking layer between a semiconductor base and the interlayer dielectric layer. Since the blocking layer is provided with at least one layer of an etch stop layer, and steps are formed on the surface of the blocking layer, at least two levels of formed hole field plates are distributed in a step shape, and lower ends of the first level of hole field plates to the nth level of hole field plates are gradually further away from the drift area in the direction from a gate structure to a drain area.

20 Claims, 4 Drawing Sheets

(51) Int. Cl.
  *H01L 29/40* (2006.01)
  *H01L 29/66* (2006.01)
(58) Field of Classification Search
  CPC ........... H01L 29/66659; H01L 29/1045; H01L 29/7835; H01L 29/78; H01L 29/7816; H01L 29/402; H01L 29/66674–66734; H01L 29/7801–7826; H01L 29/0856–0869; H01L 29/0873–0886; H01L 21/027–0338; H01L 29/41783; H01L 21/823418
  See application file for complete search history.

(56) References Cited

U.S. PATENT DOCUMENTS

| | | |
|---|---|---|
| 2014/0167171 A1 | 6/2014 | Kaya et al. |
| 2015/0137230 A1 | 5/2015 | Liao |
| 2019/0221666 A1* | 7/2019 | Bang .................. H01L 29/7835 |
| 2019/0288066 A1 | 9/2019 | Lee et al. |
| 2019/0334032 A1* | 10/2019 | Ho .................... H01L 29/66659 |
| 2021/0028299 A1* | 1/2021 | Liu ................... H01L 29/42376 |

FOREIGN PATENT DOCUMENTS

| | | |
|---|---|---|
| CN | 103872123 | 6/2014 |
| CN | 103996710 | 8/2014 |
| CN | 106298912 | 1/2017 |
| CN | 109244142 | 1/2019 |
| CN | 109979821 | 7/2019 |
| CN | 110299413 | 10/2019 |

OTHER PUBLICATIONS

CN Office Action for corresponding CN Application No. 201910948286., 6 pages.

International Search Report and Written Opinion (with English Translation) for corresponding PCT Application No. PCT/CN2020/109711, dated Nov. 26, 2020, 10 pages.

* cited by examiner

LDMOS DEVICE AND METHOD FOR PREPARING SAME

CROSS REFERENCE TO RELATED APPLICATIONS

This application is a national stage for International Application PCT/CN2020/109711, filed on Aug. 18, 2020, which claims priority to Chinese Patent Application No. 201910948286.9, entitled "LDMOS DEVICE AND METHOD FOR PREPARING SAME" filed on Oct. 8, 2019. The entireties of both applications are incorporated by reference herein for all purposes.

TECHNICAL FIELD

The present application relates to the field of semiconductors, and more particularly to an LDMOS device and a method for preparing the same.

BACKGROUND

Lateral Double-Diffused MOSFET (LDMOS) is a lateral power device, which is easily monolithically integrated with a low voltage signal and other devices, has advantages such as high voltage resistance, high gain, low distortion, and the like, and is widely used in power integrated circuits.

Structure performance of the LDMOS directly affects performance of the power integrated circuit. Main parameters for measuring the performance of the LDMOS include an on-resistance and a breakdown voltage. The smaller the on-resistance and the larger the breakdown voltage, the better the performance of the LDMOS has. In conventional technologies, a Shallow Trench Isolation (STI) technology is generally adopted to improve the breakdown voltage. However, in a process of implementing the conventional technology, inventors found that the adoption of STI technology results in an increase in the on-resistance. Therefore, there is a need to propose an LDMOS device that improves the breakdown voltage while not affecting the on-resistance.

SUMMARY

The statement herein merely provides background information related to the present application, and does not necessarily constitute the prior art.

According to various embodiments of the present application, an LDMOS device and a method for preparing the same are provided.

According to an aspect of the present application, a method for preparing an LDMOS device is provided, including:

providing a semiconductor substrate, a body region and a drift region being formed in the semiconductor substrate, a source region being provided in the body region, a drain region being provided in the drift region, and a gate structure being further formed on the semiconductor substrate;

depositing a first oxide layer on the semiconductor substrate, the first oxide layer being located on the drain region and on a part of the drift region;

forming a barrier layer on the semiconductor substrate, the barrier layer including n−1 etch stop layers, n being an integer greater than or equal to 2; wherein when n is greater than 2, the etch stop layers are provided in a stacked manner, and an insulating layer is provided between adjacent etch stop layers; the barrier layer covers the drift region and the first oxide layer, the barrier layer has a step, and a plane of the barrier layer on the drift region is lower than a plane of the barrier layer on the first oxide layer; and forming an interlayer dielectric layer and etching the interlayer dielectric layer and the barrier layer to form n levels of field plate holes; wherein a first level field plate hole to an (n−1)-th level field plate hole are provided corresponding to a first etch stop layer to an (n−1)-th etch stop layer above the drift region respectively, and an n-th level field plate hole is further provided on the (n−1)-th etch stop layer above the first oxide layer.

According to another aspect of the present application, an LDMOS device is provided, including:

a semiconductor substrate, a body region and a drift region being formed in the semiconductor substrate, a source region being provided in the body region, a drain region being provided in the drift region, and a gate structure being further provided on the semiconductor substrate;

a first oxide layer provided on a part of the drift region and adjoining the drain region;

a barrier layer, including n−1 etch stop layers, n being an integer greater than or equal to 2; wherein when n is greater than 2, the etch stop layers are provided in a stacked manner, an insulating layer is provided between adjacent etch stop layers; the barrier layer covers the drift region and the first oxide layer; the harrier layer has a step, and a plane of the barrier layer on the drift region is lower than a plane of the barrier layer on the first oxide layer; and an interlayer dielectric layer covering the semiconductor substrate;

the LIMOS device further includes n levels of hole field plates, a first level field plate hole to an (n−1)-th level hole field plate are provided corresponding to a first etch stop layer to an (n−1)-th etch stop layer above the drift region respectively, and an n-th level hole field plate is further provided on the (n−1)-th etch stop layer above the first oxide layer.

Details of one or more embodiments of the present application are set forth in the following drawings and description. Other features, objects and advantages of the present application will be apparent from the description, drawings and claims.

BRIEF DESCRIPTION OF THE DRAWINGS

In order to better describe and illustrate embodiments or examples of those inventions disclosed herein, reference may be made to one or more of the accompanying drawings. The additional details or examples used to describe the drawings should not be construed as limiting the scope of any of the disclosed invention, the presently described embodiments or examples, and the presently understood best modes of these inventions.

FIG. 2E is an LDMOS device provided by an embodiment of the present application.

DETAILED DESCRIPTION OF THE EMBODIMENTS

In order to make the objectives, technical solutions and advantages of the present application more clear, the present application will be further described in detail below with reference to the accompanying drawings and embodiments.

It should be understood that the specific embodiments described herein are merely intended to explain the present application and are not intended to limit the present application.

Unless defined otherwise, all technical and scientific terms used herein have the same meaning as commonly understood by those skilled in the art to which this application pertains. The terms used herein in the description of the present application are for the purpose of describing particular embodiments only and are not intended to be limiting of the present application. As used herein, the term 'and/or' includes any and all combinations of one or more related listed items.

Figure 1:
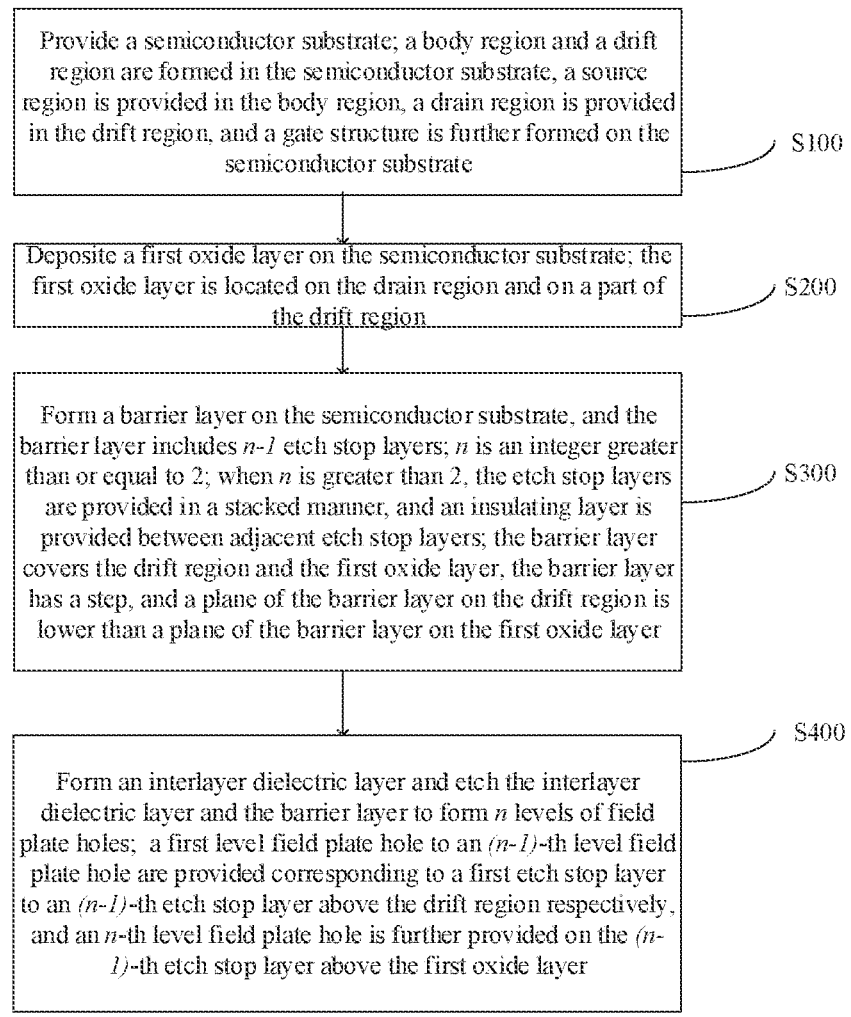
FIG. 1 is a flowchart of a method for preparing an LDMOS device according to an embodiment of the present application.

Referring to FIG. 1, an embodiment of the present application provides a method for preparing an LDMOS device, including the following steps.

In S100, a semiconductor substrate is provided. A drift region and a body region are formed in the semiconductor substrate. A drain region is provided in the drift region, a source region is provided in the body region, and a gate structure is also formed on the semiconductor substrate.

Figure 2A:
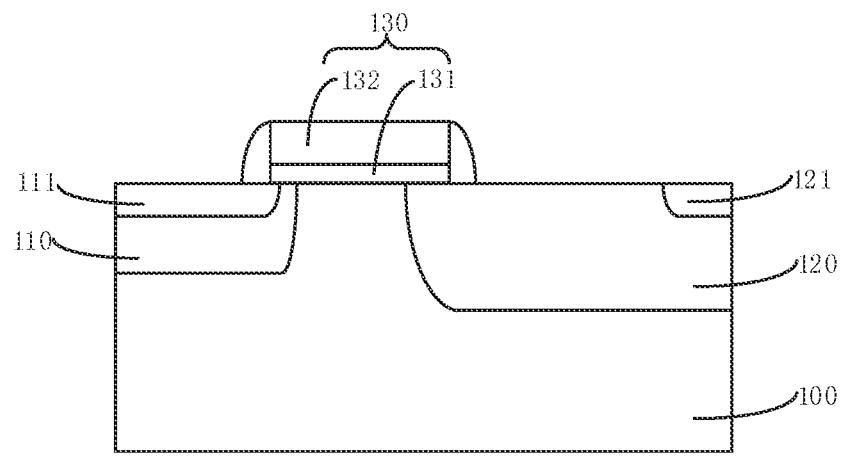
FIGS. 2A to 2E are schematic cross-sectional views of an LDMOS device prepared by the method of FIG. 1.
Figure 2B:
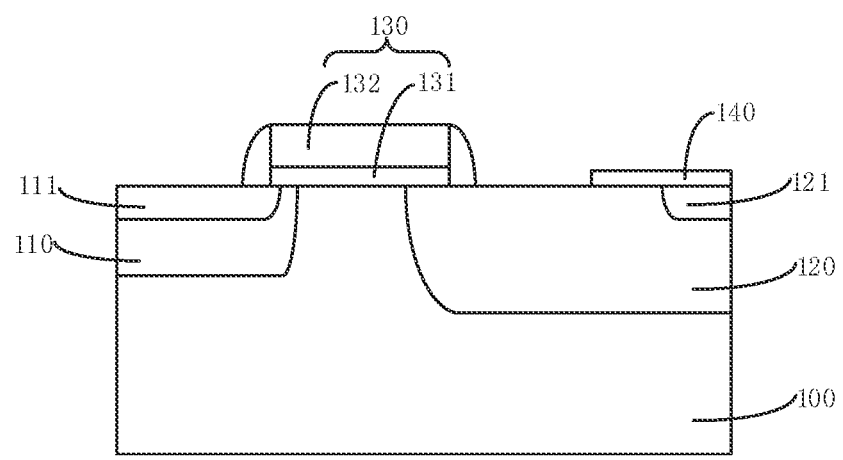

Specifically, referring to FIG. 2A, the semiconductor substrate 100 may be a silicon substrate, or a silicon on insulator (SOI) substrate and the like. In this embodiment, the semiconductor substrate 100 is a p-type silicon substrate and may be formed by epitaxial growth. A p-well is formed as the body region 110 in the semiconductor substrate 100 through a well implantation process, and then an N-type lightly doped region is formed as the drift region 120 on the semiconductor substrate 100 through an implantation process. An N-type impurity is implanted into the body region 110 to form the source region 111, and the N-type impurity is implanted into the drift region 120 to form the drain region 121. A doping concentration of the source region 111 and a doping concentration of the drain region 121 may be the same, and may be formed by doping at the same time.

The gate structure 130 is also formed on the semiconductor substrate 100, and the gate structure 130 partially overlaps with the body region 110 and the drift region 120. The gate structure 130 includes agate oxide layer 131 and a gate electrode 132 sequentially disposed on the semiconductor substrate 100. The gate oxide layer 131 may be silicon dioxide, and the gate electrode 132 may be metal, polysilicon, or the like. The gate structure 130 further includes a spacer structure on both sides of the gate electrode 132.

In the present embodiment, a shallow trench isolation structure in the vicinity of the drain region 121 is eliminated, and thus the on-resistance of the device can be reduced.

In S200, a first oxide layer is formed on the semiconductor substrate. The first oxide layer is located on the drain region and on a part of the drift region.

Specifically, a layer of oxide is deposited on the semiconductor substrate 100, and the thickness of the oxide is uniform throughout. In this embodiment, the oxide may be silicon oxide, and silicon oxide may be deposited by a chemical vapor deposition method. A photoresist is coated on the oxide and the photoresist is exposed and developed. The photoresist is used as a mask, and the silicon oxide is etched at an opening of the photoresist. After the photolithography, the oxide on the drain region 121 and the oxide on a part of the drift region 120 are retained to form the first oxide layer 140, as shown in FIG. 213. In the present embodiment, a pad: of the drift region 120 close to the gate structure 130 is defined as a front end of the drift region 120, and a part of the drift, region 120 close to the drain region 121 is defined as a rear end of the drift region 120. Since the first oxide layer 140 partially covers the rear end of the drift region 120, the thickness of the first oxide layer 140 may affect the depletion state of the rear end of the drift region 120. If the first oxide layer 140 is too thin, the rear end of the drift region 120 is depleted too fast, and it is disadvantageous for improving the breakdown voltage. If the first oxide layer 140 is too thick, this may result in an insufficient depletion of the rear end of the drift region 120. Therefore, in this embodiment, the thickness of the first oxide layer 140 is 300 Å to 1000 Å, and may be 300 Å, 500 Å, 700 Å, or 1000 Å, for example.

In S300, a barrier layer is formed on the semiconductor substrate. The barrier layer includes n−1 etch stop layers, and n is an integer greater than or equal to 2. When n is greater than 2, the etch stop layers are provided in a stacked manner, and an insulating layer is provided between adjacent etch stop layers. The barrier layer covers the drift region and the first oxide layer. The barrier layer has a step, and a plane of the barrier layer on the drift region is lower than a plane of the barrier layer on the first oxide layer.

Specifically, the harrier layer 150 includes n−1 etch stop layers, and a first etch stop layer, a second etch stop layer, and an (n−1)-th etch stop layer are sequentially arranged in a direction away from the substrate, and n is an integer greater than or equal to 2. That is, the barrier layer 150 includes at least one etch stop layer. When the barrier layer 150 includes a plurality of etch stop layers, an insulating layer is provided between two adjacent etch stop layers to insulate the adjacent etch stop layers. The barrier layer 150 uniformly covers the drift region 120 and the first oxide layer 140. Due to a height difference between the first oxide layer 140 and the drift region 120, a step may be formed on the barrier layer 150, and a plane of the barrier layer 150 covering a surface of the drift region 120 is lower than a plane of the barrier layer 150 covering a surface of the first oxide layer 140.

Figure 2C:
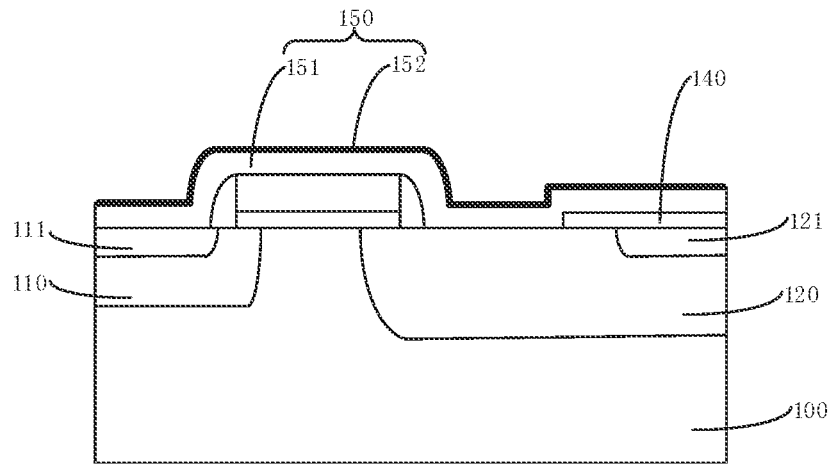

This embodiment is described by taking an example in which the barrier layer 150 includes one etch stop layer as an example. Referring to FIG. 2C, the barrier layer 150 includes an insulating layer 151 and an etch stop layer 152. Firstly, oxide and nitride are sequentially deposited on the semiconductor substrate 100 to form the insulating layer 151 and the etch stop layer 152, and the insulating layer 151 and the etch stop layer 152 cover the semiconductor substrate 100 and the first oxide layer 140. The material of the insulating layer 151 may be the same as that of the first oxide layer 140, both being silicon dioxide. The insulating layer 151 serves as a medium of a field plate formed subsequently. The material of the etch stop layer 152 is different from those of the insulating layer 151 and an interlayer dielectric layer formed subsequently, and the etch stop layer 152 serves as an etch blocking layer when the interlayer dielectric layer is etched to form a via hole. In this embodiment, the material of the etch stop layer 152 is a nitride, such as silicon nitride. On the semiconductor substrate 100, the thickness of the insulating layer 151 is the same throughout, and the thickness of the etch stop layer 152 is the same throughout. The thickness of the insulating layer 151 may affect the depletion state of the drift region. If the insulating layer 151 is too thin, the drift region 120 is depleted too fast, and it is disadvantageous for improving the breakdown voltage. Haw insulating layer 151 is too thick, this may result in an insufficient depletion of the drift region 120. Therefore, in the present application, the thickness of the insulating layer 151 is 500 Å to 2000 Å, and may be 500 Å, 1000 Å, 1500 Å, or 2000 Å, for example, and preferably, may be 1000 Å.

Figure 2D:
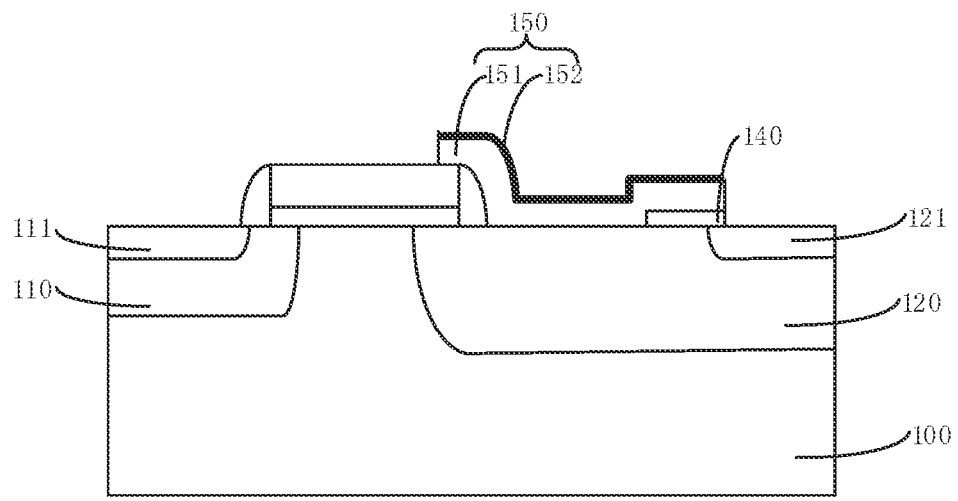

Referring to FIG. 2D, the photoresist is coated on the etch stop layer 152, and an opening is formed by exposing and developing the photoresist. The etch stop layer 152 and the insulating layer 151 are sequentially etched at the opening by using a dry etching technique with the photoresist serving as a mask, so that the retained barrier layer 150 is located on the drift region 120 and overlaps with both the gate structure 130 and the drain region 121. It should be noted that, when the barrier layer 150 above the drain region is etched, the etch stop layer 152 is firstly etched, and then the insulating layer 151 and the first oxide layer 140 are etched by changing the etching gas and adjusting the etching parameters. Since the insulating layer 151 and the first oxide layer 140 are made of the same material, the insulating layer 151 and the first oxide layer 140 may be etched away during a same etching process. After the etching is completed, the retained first oxide layer 140 is located at the rear end of the drift region 120 and a part of the drain region 121 is exposed, and the harrier layer 150 covers the drift region 120 and the first oxide layer 140. Therefore, a step is formed between the etch stop layer 152 covering the drift region 120 and the etch stop layer 152 covering the first oxide layer 140. When hole field plates are subsequently formed on the etch stop layer 152, the hole field plates may be disposed at two levels of the step, respectively, and thus forming field plates arranged in steps. That is, the medium in different thicknesses are formed on the drift region 120, so that the hole field plates may automatically stay on the barrier layer 150 to form a plurality levels of hole field plates arranged in steps. Thus, the electric field is uniformly distributed at various places in the drift region, thereby improving the breakdown voltage of the device.

In S400, an interlayer dielectric layer is formed and the interlayer dielectric layer and the barrier layer are etched to form n levels of field plate holes, and n is an integer greater than or equal to 2. A first level field plate hole to an (n−1)-th level field plate hole are provided corresponding to the first etch stop layer to the (n−1)-th etch stop layer above the drift region, respectively. In addition, an n-th level field plate hole is further provided in the interlayer dielectric layer on the (n−1)-th etch stop layer above the first oxide layer.

An oxide is deposited on the structure formed in the preceding steps to form the interlayer dielectric layer 160. The oxide may be silicon oxide, and the interlayer dielectric layer 160 may be formed by the chemical vapor deposition method. The photoresist is coated on the interlayer dielectric layer 160 and the photoresist is exposed and developed to form an opening on the photoresist. The interlayer dielectric layer 160 is etched with the photoresist as a mask to form n levels of field plate holes. The first level field plate hole to the (n−1)-th level field plate hole are provided corresponding to the first etch stop layer to the (n−1)-th etch stop layer above the drift region 120, respectively. That is, the etching of the first level field plate hole stops at the corresponding first etch stop layer on the drift region 120, the etching of the second level field plate hole stops at the corresponding second etch stop layer on the drift region 120, and the etching of the (n−1)-th level field plate hole stops at the corresponding (n−1)-th etch stop layer on the drift region 120. Further, the n-th level field plate is further provided on the (n−1)-th etch stop layer located above the first oxide layer 140. In this way, field plate holes arranged in steps may be formed in a direction from the gate structure 130 to the drain region 121. A distance between a lower end of the first level field plate hole close to the gate structure 130 and the drift region 120 is the smallest, and a distance between the n-th level field plate hole close to the drain region 121 and the drift, region 120 is the largest. That is, since the medium in different thicknesses are formed on the drift region 120, the field plate holes may automatically stay in the interlayer dielectric layer on respective etch stop layers to form the plurality levels of field plate holes arranged in steps.

Figure 2E:
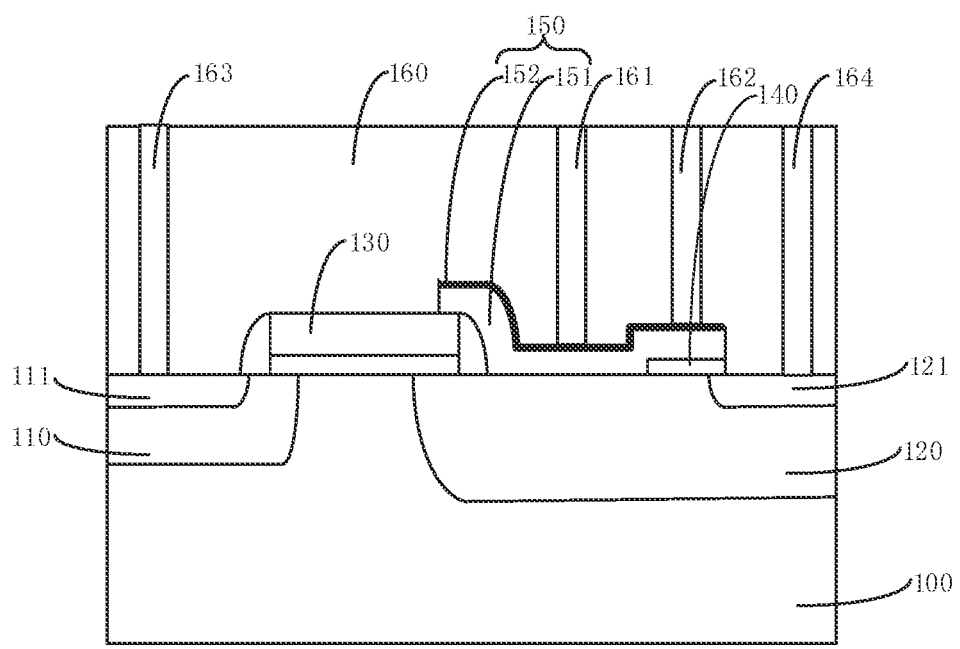

Referring to FIG. 2E, when the barrier layer 150 includes one etch stop layer 152, two levels of field plate holes may be formed. The etching of the first level field plate hole stops at the corresponding etch stop layer 152 on the drift region 120, and the etching of second level field plate hole stops at the corresponding etch stop layer 152 on the first oxide layer 140. The first level field plate hole and the second level field plate hole are filled with metal to form a first level hole field plate 161 and a second level hole field plate 162, The first level hole field plate 161 and the second level hole field plate 162 are respectively located on two adjacent levels of the step.

In the present embodiment, a source contact hole and a drain contact hole are further formed while the n levels of field plate holes are formed by etching the interlayer dielectric layer 160. The source contact hole penetrates through the interlayer dielectric layer 160 and stops at the source region 111, and the drain contact hole penetrates through the interlayer dielectric layer 160 and stops at the drain region 121. After the via hole is etched, the source contact hole and the drain contact hole are filled with metal to form a source electrode 163 and a drain electrode 164, The metal may be cobalt or copper.

In the above embodiment, by providing the harrier layer 150 between the semiconductor substrate 100 and the interlayer dielectric layer 160, the etching of the field plate hole can be stopped at the barrier layer 150 when the interlayer dielectric layer 160 is etched to form the field plate hole, By providing the first oxide layer 140 between the barrier layer 150 and the drift region, a step can be formed on a surface of the barrier layer 150, and the field plate holes arranged in steps can thus be formed, Because the field plate holes arranged in steps are formed in the direction from the gate structure ISO to the drain region 121, the distance between the lower end of the first level field plate hole close to the gate structure 130 and the drift region 120 is the smallest, and the distance between the n-th level field plate hole close to the drain region 121 and the drift region 120 is the largest. In this way, the electric field between the front end and the rear end of the drift region 120 can be more uniformly distributed and the breakdown voltage of the LDMOS device can be improved. In addition, since the shallow trench isolation structure in the vicinity of the drain region 121 is eliminated in the present application, the on-resistance can be reduced. For this reason, the present solution improves the breakdown voltage of the device while reducing the on-resistance, so that the device has more excellent performance.

Referring to FIG. 2E, the present application further provides an LDMOS device, including a semiconductor substrate 100. A body region 110 and a drift region 120 are formed in the semiconductor substrate 100, A source region 111 is provided in the body region 110, and a drain region 121 is provided in the drift region. A gate structure ISO is also provided on the semiconductor substrate 100. The gate structure 130 includes a gate oxide layer and a gate electrode sequentially disposed on a substrate. The gate structure ISO further includes a spacer structure disposed on both sides of the gate oxide layer and the gate electrode.

The first oxide layer 140 is disposed on a part of the drift region 120 and adjoins the drain region 121. The material of the first oxide layer 140 may be silicon oxide. In the present embodiment, the thickness of the first oxide layer 140 may be 300 Å to 1000 Å, for example, may be 300 Å, 500 Å, 700 Å, or 1000 Å.

The barrier layer 150 is provided on the semiconductor substrate 100 and covers the drift region 120 and the first oxide layer 140. Sidewalls of the barrier layer 150 and sidewalls of the first oxide layer 140 are located in a same plane, that is, the barrier layer 150 completely covers the first oxide layer 140, and the barrier layer 150 overlaps with both the gate structure 130 and the drain region 121. The barrier layer 150 overlaps with the gate structure 130 and extends onto the gate electrode. The barrier layer 150 can extend the distance between the drain region 121 and the polycrystalline structure of the gate structure, further improving the breakdown voltage of the device. The barrier layer 150 includes n−1 etch stop layer(s) sequentially disposed on the semiconductor substrate 100, and n is an integer greater than or equal to 2. When n is greater than 2, the etch stop layers are provided in a stacked manner, and an insulating layer is provided between adjacent etch stop layers. The material of the insulating layer may be the same as the material of the first oxide layer 140, both being silicon oxide. The thickness of the insulating layer may be 500 Å to 2000 Å, for example, may be 500 Å, 1000 Å, 1500 Å, or 2000 Å, and preferably may be 1000 Å. The material of the etch stop layer 152 may be a nitride, such as silicon nitride. The barrier layer 150 covers the drift region 120 and the first oxide layer 140. The surface of the barrier layer 150 has a step; and a plane of the barrier layer 150 on the drift region 120 is lower than a plane of the barrier layer 150 on the first oxide layer 140.

The interlayer dielectric layer 160 covers the aforementioned devices. The material of the interlayer dielectric layer 160 is different from that of the harrier layer 150, and may be an oxide; n levels of hole field plates are further formed in the interlayer dielectric layer 160, an n is an integer greater than or equal to 2. A first level hole field plate to an (n−1)-th level hole field plate are provided corresponding to the first etch stop layer to the (n−1)-th etch stop layer above the drift region 120 respectively, and an n-th level hole field plate is provided on the corresponding (n−1)-th etch stop layer above the first oxide layer 140. In a direction from the gate structure 130 to the drain region 121, lower ends of the first level hole field plate to the n-th level hole field plate are gradually away from the drift region. A distance between the lower end of the first level hole field plate close to the gate structure 130 and the drift region 120 is the smallest, and a distance between the lower end of the n-th level hole field plate close to the drain region 121 and the drift region 120 is the largest. In this way, the electric field between the front end and the rear end of the drift region 120 can be more uniformly distributed, and the breakdown voltage of the LDMOS device can be improved.

This embodiment is described by taking an example in which the LDMOS device includes one etch stop layer as an example. The barrier layer 150 includes an insulating layer 151 and an etch stop layer 152. A plane of the etch stop layer 152 above the drift region 120 is lower than a plane of the etch stop layer 152 above the first oxide layer 140. The first level hole field plate 161 penetrates through the interlayer dielectric layer 160 and stops at the etch stop layer 152 above the drift region 120, and the second level hole field plate 162 penetrates through the interlayer dielectric layer 160 and stops at the etch stop layer 152 above the first oxide layer 140. That is, the first level hole field plate 161 and the second level hole field plate 162 are respectively located on two adjacent levels of the step. The first level hole field plate 161 and the second level hole field plate are both metal field plates, and the metal may specifically be cobalt or copper.

The LDMOS device provided by the above embodiment includes at least two levels of hole field plates. By providing the barrier layer 150 between the semiconductor substrate 100 and the interlayer dielectric layer 160, the etching of the field plate hole can be stopped at the barrier layer 150 when the interlayer dielectric layer 160 is etched to form the field plate hole. By providing the first oxide layer 140 between the barrier layer 150 and the drift region 120, a step may be formed on a surface of the barrier layer 150, so that at least two levels of hole field plates are arranged in steps. In the direction from the gate structure 130 to the drain region 121, the lower ends of the first level hole field plate to the n-th level hole field plate are gradually away from the drift region, so that the electric field between the front end and the rear end of the drift region 120 is more uniformly distributed, and the breakdown voltage of the LDMOS device is improved. In addition, since the shallow trench isolation structure in the vicinity of the drain region. 121 is eliminated, in the present application, the on-resistance can be reduced. For this reason, the present solution improves the breakdown voltage of the device while reducing the on-resistance, so that the device has more excellent performance.

The technical features of the described embodiments can be combined arbitrarily, and in order to briefly describe the description, all possible combinations of the technical features in the described embodiments are not described. However, as long as the combination of these technical features does not have any contradiction, it should be considered to be the scope of disclosure disclosed in the present description.

The above embodiments merely express several embodiments of the present application, and the description thereof is more specific and detailed, but cannot be construed as limiting the scope of the patent accordingly, it should be noted that, for a person of ordinary skill in the art, several modifications and improvements can also be made without departing from the concept of the present application, which all belong to the scope of protection of the present application. Therefore, the scope of protection of the present application should be based on the appended claims.

What is claimed is:

1. A method for preparing a lateral double-diffused metal oxide semiconductor field-effect transistor (LDMOS) device, comprising:
   providing a semiconductor substrate, a body region and a drift region being formed in the semiconductor substrate, a source region being provided in the body region, a drain region being provided in the drift region, and a gate structure being further formed on the semiconductor substrate;
   depositing a first oxide layer on the semiconductor substrate, the first oxide layer being located on the drain region and on a part of the drift region;
   forming a barrier layer on the semiconductor substrate, the barrier layer comprising n−1 etch stop layers, n being an integer greater than or equal to 2;
   wherein when n is greater than 2, the etch stop layers are provided in a stacked manner, and an insulating layer is provided between adjacent etch stop layers; the barrier layer covers both directly on the drift region and directly on the first oxide layer, the barrier layer has a step, and a plane of the barrier layer directly covered on the drift region is lower than a plane of the barrier layer directly covered on the first oxide layer; and forming an interlayer dielectric layer and etching the interlayer dielectric layer and the barrier layer to form n levels of field plate holes;

wherein a first level field plate hole to an (n−1)-th level field plate hole are provided in the interlayer dielectric layer and are stopped at a first etch stop layer to an (n−1)-th etch stop layer corresponding to the barrier layer directly covered on the drift region respectively, and an n-th level field plate hole is further provided in the interlayer dielectric layer and is stopped at the (n−1)-th etch stop layer corresponding to the barrier layer directly covered on the first oxide layer.

2. The method for preparing the LDMOS device according to claim 1, wherein the interlayer dielectric layer comprises an oxide.

3. The method for preparing the LDMOS device according to claim 2, wherein the forming the interlayer dielectric layer and etching the interlayer dielectric layer and the barrier layer to form the n levels of field plate holes further comprises:

etching the interlayer dielectric layer to form a source contact hole and a drain contact hole simultaneously, wherein an etching of the source contact hole stops at the source region, and an etching of the drain contact hole stops at the drain region; and filling the source contact hole, the drain contact hole, and the n levels of field plate holes with metal, to form a source electrode, a drain electrode, and an n levels of hole field plates.

4. The method for preparing the LDMOS device according to claim 3, wherein a thickness of the first oxide layer is 300 Å to 1000 Å.

5. The method for preparing the LDMOS device according to claim 4, wherein the insulating layer comprises an oxide, and a thickness of the insulating layer is 500 Å to 2000 Å.

6. The method for preparing the LDMOS device according to claim 5, wherein the etch stop layer comprises a nitride.

7. The method for preparing the LDMOS device according to claim 1, wherein the gate structure comprises a gate oxide layer and a gate electrode sequentially provided on the semiconductor substrate, and a spacer structure on both sides of the gate electrode.

8. The method for preparing the LDMOS device according to claim 1, wherein a thickness of the insulating layer is the same throughout on the semiconductor substrate, and a thickness of the etch stop layer is the same throughout on the semiconductor substrate.

9. An LDMOS device, comprising:

a semiconductor substrate, a body region and a drift region being formed in the semiconductor substrate, a source region being provided in the body region, a drain region being provided in the drift region, and a gate structure being further provided on the semiconductor substrate;

a first oxide layer provided on a part of the drift region and adjoining the drain region; a barrier layer, comprising n−1 etch stop layers, n being an integer greater than or equal to 2;

wherein when n is greater than 2, the etch stop layers are provided in a stacked manner, an insulating layer is provided between adjacent etch stop layers;

the barrier layer covers both directly on the drift region and directly on the first oxide layer;

the barrier layer has a step, and a plane of the barrier layer directly covered on the drift region is lower than a plane of the barrier layer directly covered on the first oxide layer; and an interlayer dielectric layer covering the semiconductor substrate;

wherein the LDMOS device further comprises n levels of hole field plates, a first level hole field plate to an (n−1)-th level hole field plate are provided on a first etch stop layer to an (n−1)-th etch stop layer corresponding to the barrier layer directly covered on the drift region respectively, and an n-th level hole field plate is further provided on the ((n−1)-th etch stop layer corresponding to the barrier layer directly covered on the first oxide layer.

10. The LDMOS device according to claim 9, wherein in a direction from the gate structure to the drain region, lower ends of the first level hole field plate to the n-th level hole field plate are sequentially away from the drift region, and a distance between the lower end of the first level hole field plate close to the gate structure and the drift region is the smallest, and a distance between the lower end of the n-th level hole field plate close to the drain region and the drift region is largest.

11. The LDMOS device of claim 9, wherein the interlayer dielectric layer comprises an oxide.

12. The LDMOS device of claim 9, wherein the barrier layer overlaps with both the gate structure and the drain region.

13. The LDMOS device according to claim 10, wherein a thickness of the first oxide layer comprises 300 Å to 1000 Å.

14. The LDMOS device of claim 10, wherein the hole field plate is a metal hole field plate.

15. The LDMOS device of claim 14, wherein the etch stop layer comprises a nitride.

16. The LDMOS device according to claim 15, wherein the gate structure comprises a gate oxide layer and a gate electrode sequentially provided on the semiconductor substrate, and a spacer structure disposed on both sides of the gate electrode.

17. The LDMOS device according to claim 9, wherein a part of the drift region close to the gate structure is defined as a front end of the drift region, a part of the drift region close to the drain region is defined as a rear end of the drift region, and the first oxide layer partially covers the rear end of the drift region.

18. The LDMOS device according to claim 9, wherein a thickness of the insulating layer is the same throughout on the semiconductor substrate, and a thickness of the etch stop layer is the same throughout on the semiconductor substrate.

19. The LDMOS device according to claim 9, wherein the barrier layer completely covers the first oxide layer.

20. The LDMOS device according to claim 10, wherein the insulating layer comprises an oxide, and a thickness of the insulating layer is 500 Å to 2000 Å.

* * * * *